United States Patent [19]
Lee

[11] Patent Number: 6,017,662
[45] Date of Patent: Jan. 25, 2000

[54] METHOD OF REDUCING LASER MARK PEELING

[75] Inventor: Tzung-Han Lee, Taipei, Taiwan

[73] Assignee: United Microelectronics Corp., Taipei, Taiwan

[21] Appl. No.: 09/181,298

[22] Filed: Oct. 28, 1998

[51] Int. Cl.[7] ....................................................... G03F 9/00
[52] U.S. Cl. ............................................. 430/30; 430/22
[58] Field of Search ......................................... 430/30, 22

Primary Examiner—Christopher G. Young
Attorney, Agent, or Firm—Thomas, Kayden, Horstemeyer & Risle

[57] ABSTRACT

A method of reducing laser mark peeling depends on what sort of layer lies over the laser mark. If a structure formed on the laser mark is a conductive layer, an adhesion layer or a passivation layer, the conductive layer, adhesion layer or passivation layer is removed from the laser mark. If a structure formed on a laser mark is a dielectric layer, the dielectric layer is left on the laser mark. The area removed from the upper layer is equal to or bigger than the area removed from the lower layer in order to avoid contacts between the conductive layers. In addition to being used for a laser mark, the method mentioned above can be also used for a wafer edge and an alignment mark.

15 Claims, 2 Drawing Sheets

METHOD OF REDUCING LASER MARK PEELING

BACKGROUND OF THE INVENTION

1. Field of Invention

The present invention relates to a method of reducing peeling on wafer edges, laser marks and alignment marks. Additionally, the present invention relates to a method of easily reading wafer edges, laser marks and alignment marks.

2. Description of Related Art

FIG. 1 is a schematic, top view of a wafer with a laser mark. Before performing any processes on a wafer 102, laser mark trenches 106 are formed by a laser marking method on given locations outside defined die ranges 104 formed on the wafer 102. A laser mark 100 is composed of several laser mark trenches 106. The laser mark 100 is used for distinguishing lots of wafers 102.

FIG. 2 is a schematic, cross-sectional view of the area of the wafer with laser marks, showing how, in the later semiconductor processes, the wafer mark 202 on the wafer 200 is covered with a dielectric layer, a polysilicon layer and a metal layer in a stratified structure because of insulating requirements or layout of the wafer 200. The wafer 200 is covered with a polysilicon layer 204, a tungsten silicide layer 206 and a metal layer 208. A dielectric layer 210 is formed between the tungsten silicide layer 206 and the metal layer 208 for isolating conductive layers. In addition, a titanium nitride/titanium layer 212 used as an adhesion layer is formed on the dielectric layer 210 before forming the metal layer 208 in order to increase adhesion between the metal layer 208 and the dielectric layer 210. Finally, a thicker passivation layer 214 is further formed on the wafer 200 to ensure that structures on the wafer 200 are protected from damage.

The tungsten silicide layer 206 covering the laser mark 202 mentioned above is in direct contact with the polysilicon layer 204. The titanium nitride/the titanium layer 212 may also be deposited directly on the polysilicon layer 204. The adhesion between the tungsten silicide layer 206 and the polysilicon layer 204 or the titanium nitride layer 212 and the polysilicon layer 204 is bad, therefore, peeling easily occurs on the tungsten silicide layer 206 and the titanium nitride layer 212 after performing a later thermal process. The peeling has a bad effect on the processes.

In general, a chemical mechanical polishing process is introduced to planarize the metal layer 208 after forming the metal layer 208. The planarized surface of the metal layer 208 is quite reflective, which makes the laser mark 202 below the metal layer 208 difficult to distinguish. The thicker passivation layer 214 required in the last processes of semiconductors is formed on the wafer 200 to protect the wafer 200, but the laser mark 202 is difficult to distinguish because of the overly thick passivation layer 214.

SUMMARY OF THE INVENTION

Accordingly, the present invention is mainly to provide a method of reducing laser mark peeling The method is to remove a conductive layer that may be formed on a laser mark, and to leave a dielectric layer above the conductive layer. Therefore, the condition that a titanium nitride layer is in direct contact with a polysilicon layer or a polysilicon layer is covered with a tungsten silicide layer does not occur. Peeling can be avoided.

In addition, another purpose of the invention is to provide a method of easily reading laser marks. A conductive layer and a passivation layer above the laser mark are removed in order to avoid reflection from the planarized metal layer and obstruction due to the thick passivation layer when attempting to read the laser marks.

Another purpose of the invention is that a method of removing a conductive layer or a metal layer can be used on wafer edges and alignment marks to avoid peeling of the wafer edge and alignment mark and to permit easy reading.

To achieve these and other advantages and in accordance with the purpose of the invention, as embodied and broadly described herein, the invention provides a method of reducing laser mark peelings. If a conductive/adhesion layer or a passivation layer is formed on a laser mark, portions of the conductive/adhesion layer or the passivation layer on the laser mark are removed. If a dielectric layer is formed on a laser mark, the dielectric layer is left. Areas removed from the upper layers are equal to or bigger than areas removed from the lower layers in order to avoid contact between conductive layers. In addition to being used for laser marks, the method mentioned can also be used for a wafer edge and an alignment mark.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description serve to explain the principles of the invention. In the drawings.

DESCRIPTION OF THE PREFERRED EMBODIMENTS

Figure 1:
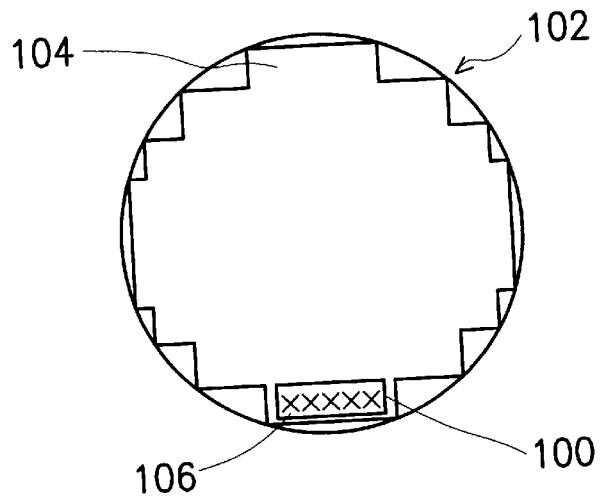
FIG. 1 is a top view of a wafer with a laser mark.
Figure 2:
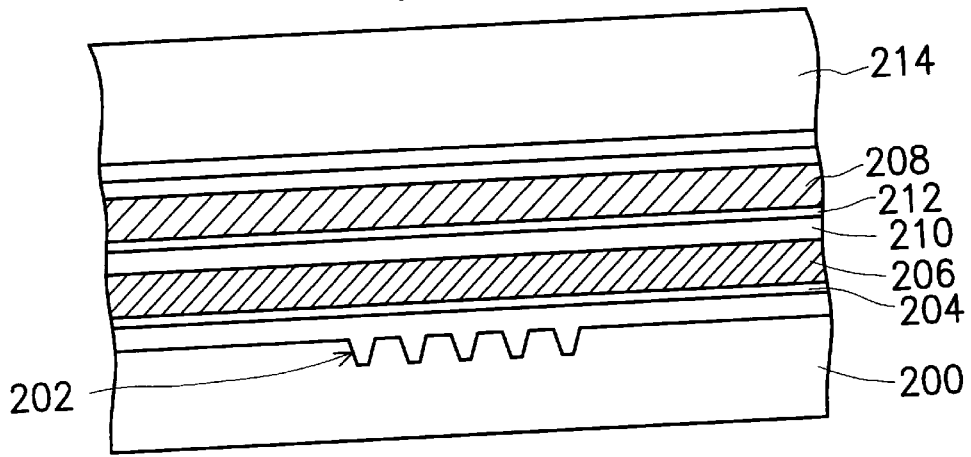
FIG. 2 is a cross-sectional view of a conventional laser mark

Reference will now be made in detail to the present preferred embodiments of the invention, examples of which are illustrated in the accompanying drawings. Wherever possible, the same reference numbers are used in the drawings and the description to refer to the same or like parts.

In the conventional method, peeling occurs on a tungsten silicide layer, a polysilicon layer and a titanium nitride layer having bad adhesion to a laser mark during a later thermal process. In addition, it is difficult to distinguish the laser marks because a metal layer formed on the wafer later undergoes a planarization process. Finally, formation of a thick passivation layer on the wafer leads to difficulties in distinguishing the laser marks. Therefore, the invention provides a method of reducing the laser mark peeling that can affect performance of a device and allow it to be easily read. The invention can also be used to avoid peeling on a wafer edge and an alignment mark and to allow the alignment mark to be easily distinguished.

Figure 3:
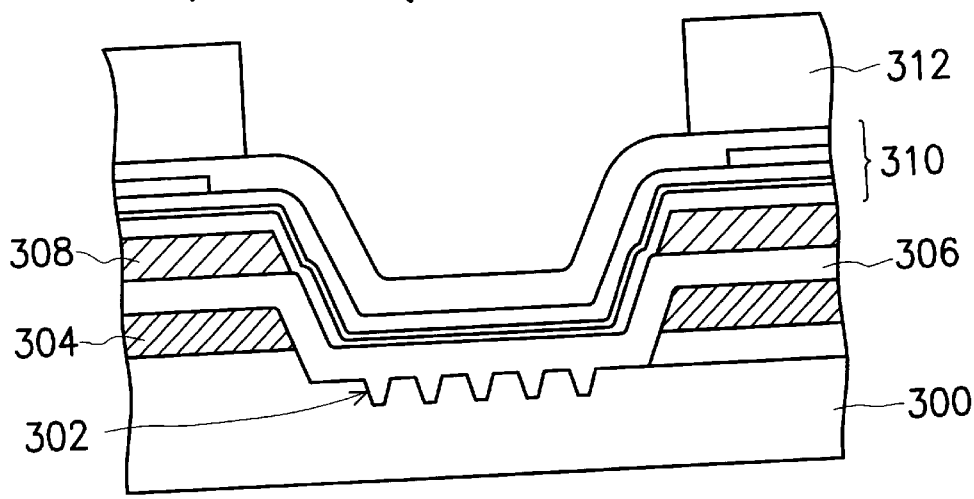
FIG. 3 is a cross-sectional view showing a method of reducing laser mark peeling according to the preferred embodiment of this invention.

FIG. 3 is a cross-sectional view showing a method of reducing a laser mark peeling according to one preferred embodiment of this invention. A laser mark 302 is formed on a wafer 300 to distinguish lots of wafers. A conductive layer and a dielectric layer are formed on the wafer 300 according to the required layout of dies on the wafer 300. The main purpose of the invention is to remove a conductive layer, such as a polysilicon layer, a tungsten silicide layer, a metal layer or a passivation layer, from the laser mark 302 and to leave a dielectric layer. For example, a structure 304 is formed on the laser mark 302. If the structure 304 is a conductive layer, the conductive layer 304 on the laser mark 302 is removed by a photolithography etching process. If the structure 306 is a dielectric layer, the dielectric layer 306 is left to cover the laser mark 302 and the conductive layer 304. Then, if a structure 308 formed afterwards is a conductive layer, the structure 308 is also removed by a photolithography etching process, wherein the area removed from the structure 308 is equal to or bigger than the area removed from the structure 304. Thus, shorts caused by overetching the dielectric layer can be avoided. A dielectric layer 310, such as an inter-poly dielectric layer (IPD). an inter-layer dielectric (ILD) layer or intermetal dielectric (IMD) layer formed afterwards can also be left on the laser mark 302. If a structure 312 formed in the last process is a passivation layer, the passivation layer is removed by a process, such as a photolithography etching process, because the too-thick passivation layer affects the ability to distinguish the laser mark 302.

Figure 4:
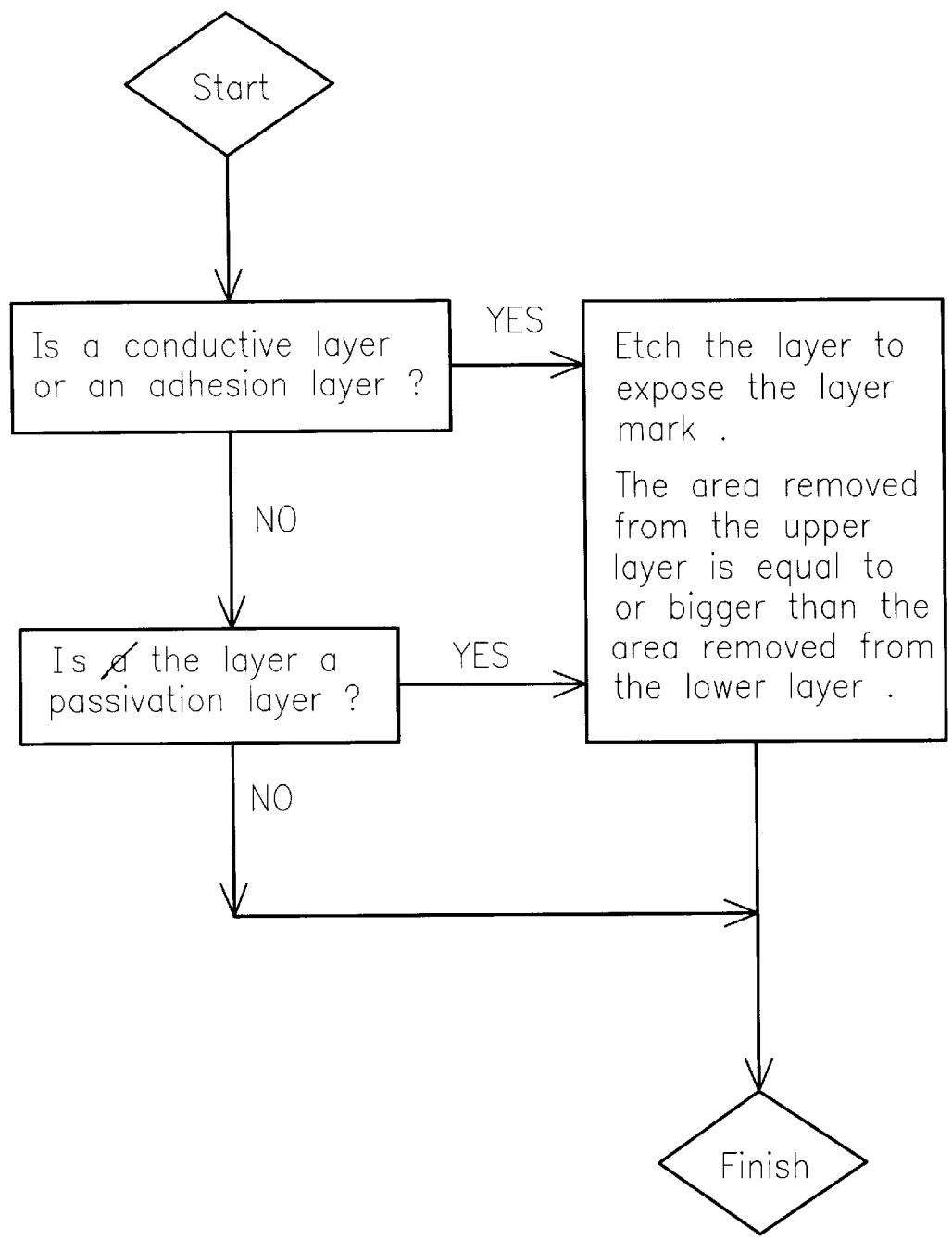
FIG. 4 is a flow chart showing a method of reducing laser mark peeling according to the preferred embodiment of this invention.

FIG. 4 is a flow chart showing a method of reducing laser mark peelings according to the preferred embodiment of the invention. First, if a structure formed on a laser mark is a conductive/adhesion layer, a photolithography etching process is performed to remove the structure through exposure and development. If a structure formed on a laser mark is a non-conductive/adhesion layer, then it is necessary to determine if the structure is a passivation layer. If the structure is a passivation layer, the passivation layer on the laser mark is removed. If the structure is a dielectric layer of the non-conductive/adhesion layer, the passivation layer is left on the laser mark.

Therefore, one feature of the invention is to remove a conductive/adhesion layer, such as a polysilicon layer, a tungsten silicide layer, a metal layer and a titanium nitride layer, from the laser mark and to remove a passivation layer. Thus, a peeling phenomenon caused by direct contact between the tungsten silicide layer and the polysilicon layer or the titanium nitride layer and the polysilicon layer can be avoided in the conventional method. Moreover, difficulties of distinguishing the laser mark due to planarization of the metal layer and an overly-thick passivation layer can also be avoided by removing the metal layer and the passivation layer.

Another feature of the invention is to apply the method mentioned above to a wafer edge and an alignment mark. After a conductive layer is formed, the conductive layers on the wafer edge and the alignment mark are immediately removed. Then, deposition of a next layer is performed. In addition, an adhesion layer and a passivation layer are also removed immediately after formation. Therefore, alignment and reading functions provided by the wafer edge and the alignment mark are easily processed.

It will be apparent to those skilled in the art that various modifications and variations can be made to the structure of the present invention without departing from the scope or spirit of the invention. In view of the foregoing it is intended that the present invention cover modifications and variations of this invention provided they fall within the scope of the following claims and their equivalents.

What is claimed is:

1. A method of reducing laser mark peeling, comprising the steps of:

providing a wafer having a laser mark; and forming a structure on the wafer wherein if the structure is a conductive/adhesion layer, the conductive/adhesion layer is removed from the laser mark, and if the structure is a dielectric layer, the dielectric layer is left on the laser mark.

2. A method according to claim 1, wherein the conductive layer comprises one of a group of a polysilicon layer, a metal silicide layer and a metal layer.

3. A method according to claim 1, wherein the adhesion layer comprises a titanium nitride/titanium layer.

4. A method according to claim 1, wherein the method can be used in preventing a wafer edge from peeling.

5. A method according to claim 1, wherein the method can be used in preventing an alignment mark from peeling.

6. A method of reducing laser mark peeling, comprising the steps of:

providing a wafer having a laser mark;

forming a first structure on the wafer wherein if the first structure is a first conductive/adhesion layer, the first conductive/adhesion layer is removed from the laser mark, and if the first structure is a first dielectric layer, the first dielectric layer is left on the laser mark; and forming a second structure on the wafer wherein if the second structure is a second conductive/adhesion layer, the second conductive/adhesion layer is removed from the laser mark, and if the second structure is a second dielectric layer, the second dielectric layer is left on the laser mark;

wherein area removed from the first conductive/adhesion layer on the laser mark is equal to or bigger than area removed from the second conductive/adhesion layer on the laser mark.

7. A method according to claim 6, wherein the conductive layer comprises one of a group of a polysilicon layer, a metal silicide layer and a metal layer.

8. A method according to claim 6, wherein the first adhesion layer and the second adhesion layer comprise a titanium nitride/titanium layer.

9. A method according to claim 6, wherein the method can be used in preventing a wafer edge from peeling.

10. A method according to claim 6, wherein the method can be used in preventing an alignment mark from peeling.

11. A method of reducing laser mark peeling, comprising the steps of:

providing a wafer having a laser mark;

forming a first structure on the wafer wherein if the first structure is a first conductive layer, the first conductive layer is removed from the laser mark, and if the first structure is a first dielectric layer, the first dielectric layer is left on the laser mark; and forming a second structure on the wafer wherein if the second structure is a second conductive layer, the second conductive layer is removed from the laser mark, if the second structure is a second passivation layer, the second passivation layer is removed from the laser mark, and if the second structure is a dielectric layer, the second dielectric layer is left on the laser mark;

wherein area removed from the first conductive/adhesion layer on the laser mark is equal to or bigger than area removed from the second conductive/adhesion layer on the laser mark.

12. A method according to claim 11, wherein the conductive layer comprises at least one of a group of a polysilicon layer, a metal silicide layer and a metal layer.

13. A method according to claim 11 wherein the first adhesion layer and the second adhesion layer comprise a titanium nitride/titanium layer.

14. A method according to claim 11, wherein the method can be used in preventing a wafer edge from peeling.

15. A method according to claim 11, wherein the method can be used to prevent an alignment mark from peeling.

* * * * *